United States Patent
Park et al.

(10) Patent No.: US 7,180,138 B2
(45) Date of Patent: Feb. 20, 2007

(54) SOI STRUCTURE HAVING A SIGE LAYER INTERPOSED BETWEEN THE SILICON AND THE INSULATOR

(75) Inventors: Jeagun Park, Sungnam (KR); Kenji Tomizawa, Noda (JP); Gonsub Lee, Seoul (KR); Eiji Kamiyama, Noda (JP)

(73) Assignees: Sumitomo Mitsubishi Silicon Corp., Tokyo (JP); Jeagun Park, Sungnam (KR)

( * ) Notice: Subject to any disclaimer, the term of this patent is extended or adjusted under 35 U.S.C. 154(b) by 0 days.

(21) Appl. No.: 11/150,292

(22) Filed: Jun. 13, 2005

(65) Prior Publication Data
US 2005/0242396 A1 Nov. 3, 2005

Related U.S. Application Data

(63) Continuation of application No. 10/354,197, filed on Jan. 30, 2003, now abandoned.

(60) Provisional application No. 60/352,260, filed on Jan. 30, 2002.

(51) Int. Cl.
*H01L 27/01* (2006.01)
(52) U.S. Cl. .................. 257/352; 257/616
(58) Field of Classification Search .......... 257/347, 257/349, 352, 616, 192
See application file for complete search history.

(56) References Cited

U.S. PATENT DOCUMENTS

| | | | |
|---|---|---|---|
| 5,218,213 A | 6/1993 | Gaul et al. | |
| 5,352,912 A | 10/1994 | Crabbe et al. | |
| 5,767,549 A | 6/1998 | Chen et al. | |
| 7,033,913 B2 * | 4/2006 | Usuda et al. | 438/459 |
| 2003/0230778 A1 * | 12/2003 | Park et al. | 257/349 |

* cited by examiner

*Primary Examiner*—Mark V. Prenty
(74) *Attorney, Agent, or Firm*—Oblon, Spivak, McClelland, Maier & Neustadt, P.C.

(57) ABSTRACT

A semiconductor structure and a method of manufacturing a silicon on insulator (SOI) structure having a silicon germanium (SiGe) layer interposed between the silicon and the insulator. According to one manufacturing method, a first SiGe layer, a silicon layer, and a second SiGe layer are epitaxially grown in sequence over a first substrate, and then an insulating layer is formed on the second SiGe layer. Then, impurity ions are implanted into a predetermined location of the first substrate underlying the first SiGe layer to form an impurity implantation region. A second substrate is bonded to the insulating layer on the first substrate. After the first substrate is separated along the impurity implantation region and removed, the first SiGe layer remaining on the surface of the separated region is removed so that the surface of the silicon layer may be exposed.

13 Claims, 20 Drawing Sheets

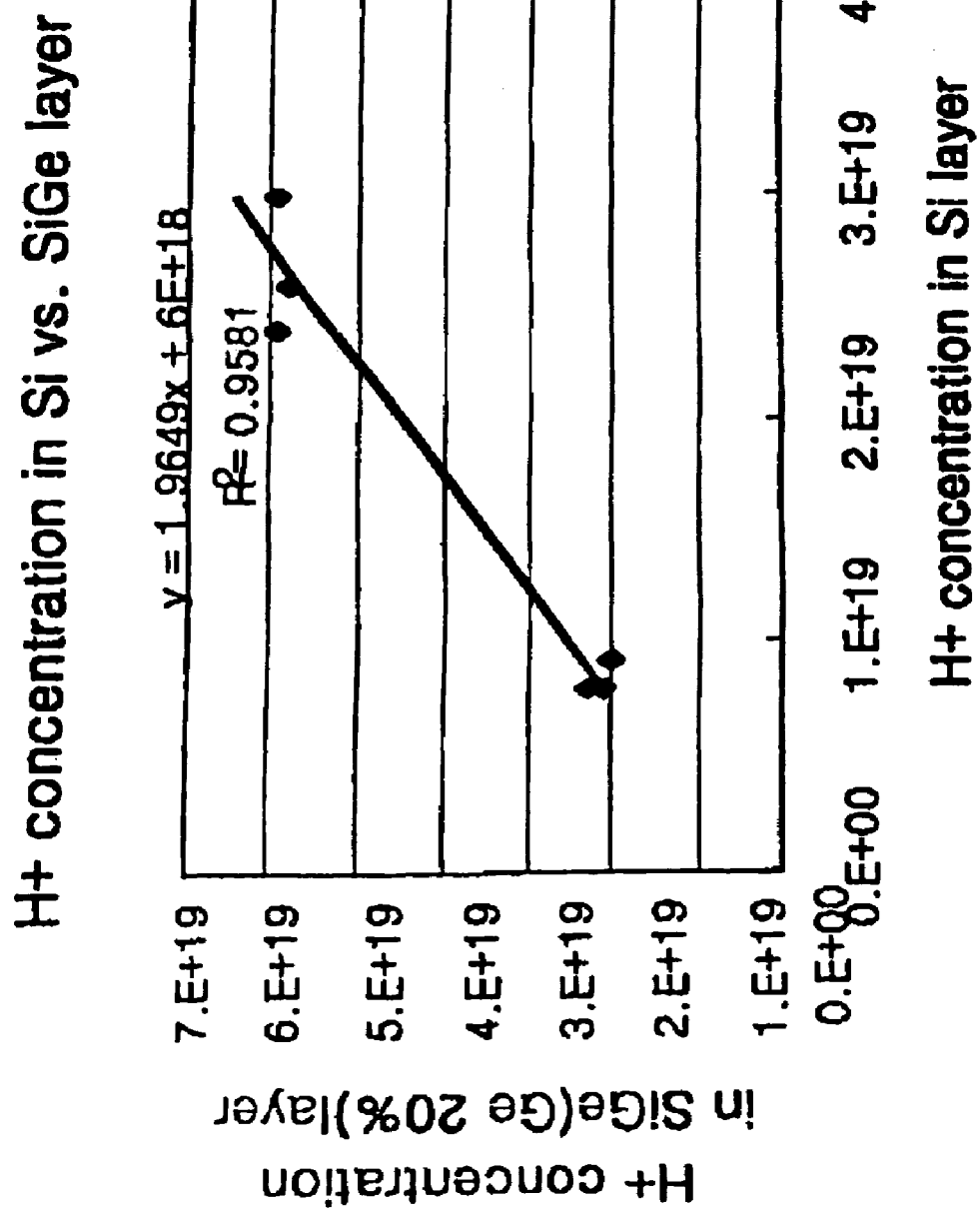
Fig.31.B

Si(96nm)/SiGe(5nm)/Si(60.8nm)/SiGe(29nm)/
Si(72.4nm)/SiO2(186nm)

SOI STRUCTURE HAVING A SIGE LAYER INTERPOSED BETWEEN THE SILICON AND THE INSULATOR

CROSS-REFERENCE TO RELATED APPLICATIONS

This application claims benefit of priority under 35 U.S.C. § 119 to U.S. provisional application 60/352,260 filed Jan. 30, 2002, the entire contents of which are incorporated by reference. This application is continuation of and claims priority under 35 U.S.C. § 120 U.S. Ser. No. 10/354,197 filed Jan. 30, 2003 now abadonded.

BACKGROUND OF THE INVENTION

1. Field of the Invention

The present invention relates to silicon-on-insulator (SOI) wafer device isolation technology, and more particularly to a method of fabricating a modified SOI structure having a buried semiconductor layer.

2. Description of the Related Art

PN junction isolation between adjacent devices on a bulk silicon substrate is used in the manufacture of silicon integrated circuits, but is not suitable for high voltage applications since junction breakdowns occur at supply voltages of about ±30 V under appropriate doping level and dimensions. Furthermore, PN junction isolation between the adjacent devices is not effective in a radioactive environment due to transient photocurrent caused by gamma rays at the PN junction.

To overcome the above noted disadvantages of conventional PN junction isolation techniques, silicon on insulator (SOI) technologies have been developed. In SOI technologies, a device is completely encompassed with an insulating material in place of the normal PN junction. Circuits manufactured on a SOI substrate have advantages in that the overall chip size is reduced, the fabrication process and resulting structure are simplified compared to circuits manufactured in a bulk silicon substrate, and parasitic capacitances between the devices and the bulk silicon substrate are reduced to achieve high speed operation thereof.

Commonly known techniques for obtaining SOI structures include silicon-on-sapphire (SOS) which allows heteroepitaxial silicon layer to be grown on sapphire, separation by implanted oxygen (SIMOX) which creates a buried silicon oxide layer by implanting oxygen ions into a silicon substrate and annealing the substrate, and bonding SOI by which at least one wafer having an insulating layer thereon is bonded to another wafer.

Despite the advantages described above, metal-oxide-semiconductor (MOS) field effect transistors (FETs) formed on a SOI wafer have a problem in that a floating body effect occurs because a buried oxide layer isolates the body of the transistor from the silicon substrate. When an NMOS transistor is operated, holes generated by impact ionization are accumulated in the electrically floating body, thereby raising a potential of the body. The increased body potential reduces the threshold voltage of the device. The increased body potential causes an undesirable kink effect in drain current vs. voltage curves of the NMOS transistor, and induces operation of a parasitic bipolar transistor, thereby leading to an instability of gate control over source-drain current.

FIG. 1 is a cross-section of a MOS transistor formed on a SOI wafer having a SiGe layer buried in the body region of the transistor thereon. Referring to FIG. 1, an insulating layer 20 is formed on a substrate 10. A silicon layer 32, a SiGe layer 34, and a silicon device layer 36 are formed in sequence on the insulating layer 20. A gate electrode 42 is formed on the device layer 36 with a gate insulating layer 40 interposed therebetween. A spacer 44 is formed on a sidewall of the gate electrode 42. A source region 46 and a drain region 48, both of which are self-aligned to the spacer 44 and doped with impurities, are formed over the device layer 36, the SiGe layer 34, and the silicon layer 32.

In the configuration of the transistor of FIG. 1, since the valence band of the SiGe material exists closer to a Fermi level than that of the silicon material, since the SiGe material has a band gap narrower than the silicon material, a potential barrier for holes is lowered at a junction of the SiGe layer 34 and the silicon device layer 36. Furthermore, when a drain voltage is applied to the MOS device, electrons cause impact ionization at the drain region 48. The holes generated by the impact ionization move to the SiGe layer 34 having a lowered potential barrier for holes and then to the source region 46 through the SiGe layer 34, thereby suppressing the floating body effect.

However, since the MOS transistor of FIG. 1 has a partially depleted structure, it has relatively low transconductance and low switching speed.

SUMMARY OF THE INVENTION

One object of the present invention is to provide a silicon on insulator (SOI) structure having a silicon germanium (SiGe) layer interposed between the silicon and the insulator. The silicon germanium layer, due to the narrow band gap characteristics of the SiGe material, suppresses both the floating body effect and the associated kink effect and increases the breakdown voltage (and thereby the drain current) of a drain in a MOS transistor formed on the SOI structure.

Another object of the present invention is to provide a SOI structure such that semiconductor devices fabricated on the SOI structure have improved transconductance and higher switching speeds as compared to devices on conventional SOI wafers.

Still another object of the present invention is to provide multiple methods of manufacturing the SOI structure of the present invention having a SiGe layer interposed between the silicon layer and the insulator.

These and other objects of the present invention are achieved by methods which fabricate a novel semiconductor structure in which the semiconductor structure includes an insulator configured to provide electrical isolation between devices formed in the semiconductor structure, a silicon germanium layer in direct contact with the insulator, and a silicon layer in contact with the silicon germanium layer.

In one method of manufacturing the SOI structure of the present invention, a first SiGe layer, a silicon layer, and a second SiGe layer are epitaxially grown in sequence over a first substrate, and then an insulating layer is formed on the second SiGe layer. Then, impurity ions are implanted into a predetermined location of the first substrate underlying the first SiGe layer to form an impurity implantation region. A second substrate is bonded to the insulating layer on the first substrate. After the first substrate is separated along the impurity implantation region and removed, the first SiGe layer remaining on the surface of the separated region is removed so that the surface of the silicon layer may be exposed, thereby forming the SOI structure of the present invention.

In one embodiment of this method, the first substrate is formed of silicon, and the impurity ions implanted in the first substrate are hydrogen ions, thus facilitating separation of the first substrate from the SiGe layers. The first SiGe layer is formed to a thickness of 10–30 Å, and the projected range of the impurity ions implanted during impurity ion implantation is 50–100 Å below the first SiGe layer. After removal of the remaining first SiGe layer, the second substrate may be annealed in a hydrogen atmosphere in order to make the surface thereof smooth.

In another method of manufacturing the SOI structure of the present invention, a SiGe layer and a silicon layer are epitaxially grown in sequence on a substrate, and then an insulating layer is formed on the silicon layer. Impurity ions are implanted into a predetermined location of the substrate underlying the SiGe layer to form an impurity implantation region, and then the substrate is annealed. Subsequently, the substrate between the impurity implantation region and the SiGe layer is thermally oxidized, and the insulating layer formed on the topmost surface of the substrate is removed, thereby forming the SOI structure of the present invention.

In another method of manufacturing the SOI structure of the present invention, a porous silicon layer is formed on a first substrate, and then a silicon layer and a SiGe layer are epitaxially grown in sequence on the porous silicon layer. Then, an insulating layer is formed on the SiGe layer, and a second substrate is bonded to the insulating layer on the first substrate. Subsequently, after the bonded first and second substrates are annealed and the first substrate is separated along the porous silicon layer and removed, the porous silicon layer remaining on the silicon layer is removed, thereby forming the SOI structure of the present invention.

BRIEF DESCRIPTION OF THE DRAWINGS

The above objects and advantages of the present invention will become more apparent by describing in detail preferred embodiments thereof with reference to the attached drawings in which:

FIGS. 31B and 31C are graphs depicting, respectively, the solubility of hydrogen in an alloy of SiGe and the solubility of hydrogen at a SiGe interface with silicon;

DETAILED DESCRIPTION OF THE INVENTION

Figure 1:
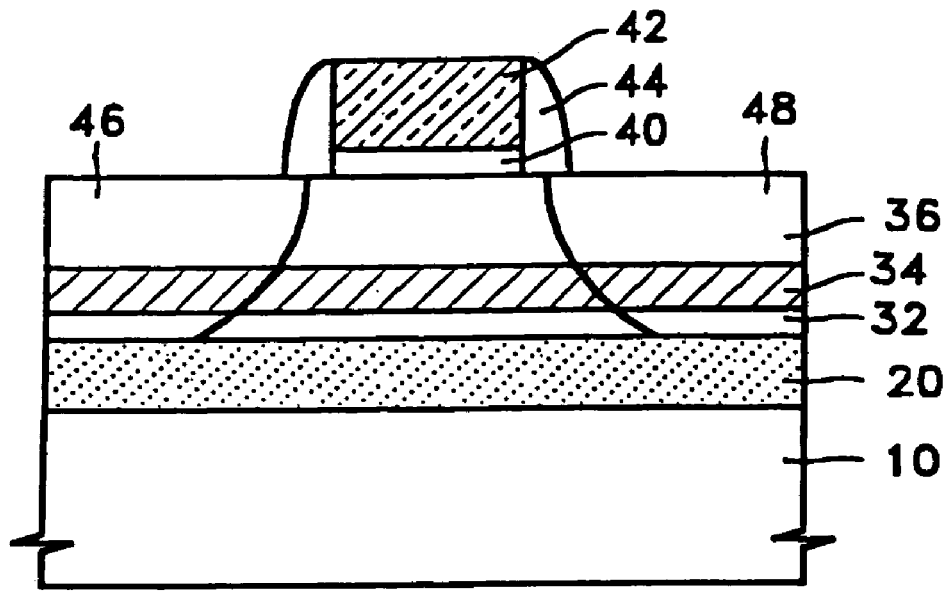
FIG. 1 is a cross-section of a metal-oxide-semiconductor (MOS) transistor formed on a conventional silicon-on-insulator (SOI) wafer having a silicon germanium (SiGe) layer interposed on top the silicon layer of the SOI structure.

This invention may be embodied in many different forms and should not be construed as being limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity, and the same reference numerals appearing in different drawings represent the same element. It will also be understood that when a layer is referred to as being "on" another layer or substrate, it can be directly on the other layer or substrate, or intervening layers may also be present.

In the present invention, a silicon germanium (SiGe) layer, having a narrow band gap in order to suppress a floating body effect, is buried in a body region (i.e., an active region of a semiconductor device) and is in contact with an insulator. This structure serves to isolate the body region of one device from a body region of another device. Embodiments of the buried SiGe layer on insulator and embodiments of a manufacturing method thereof are described below.

Figure 2A:
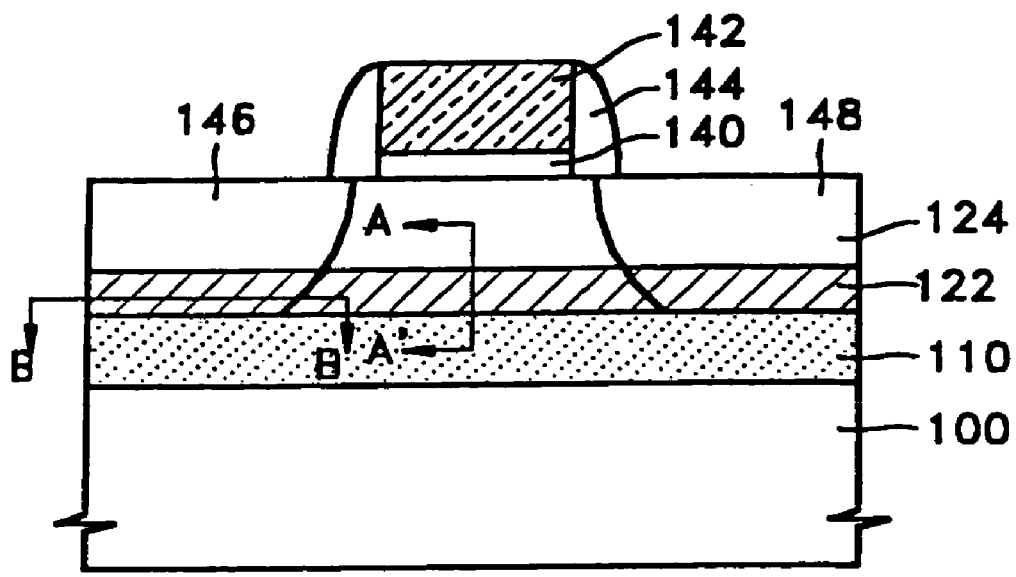
FIG. 2A is a cross-section of a MOS transistor formed on a SOI structure of the present invention having a silicon germanium (SiGe) layer interposed between the silicon layer and the insulator.

Referring to FIG. 2A, FIG. 2A depicts an insulating layer 110 on a substrate 100, and depicts a SiGe layer 122 and a device layer 124 sequentially located on the insulating layer 110. A gate electrode 142 contacts the device layer 124, between which a gate insulating layer 140 is interposed. A spacer 144 can be formed, according to the present invention, on a sidewall of the gate electrode 142. FIG. 2A depicts a source region 146 and a drain region 148, both of which are self-aligned to the spacer 144 and doped with impurities. The source region 146 and the drain region 148 are located in the device layer 124 and the SiGe layer 122. The structural difference from the MOS transistor of FIG. 1 is that, according to the present invention, the SiGe layer 122 is in contact with the insulating layer 110 and not formed on top the silicon of the SOI structure, as shown in FIG. 1.

Figure 2B:
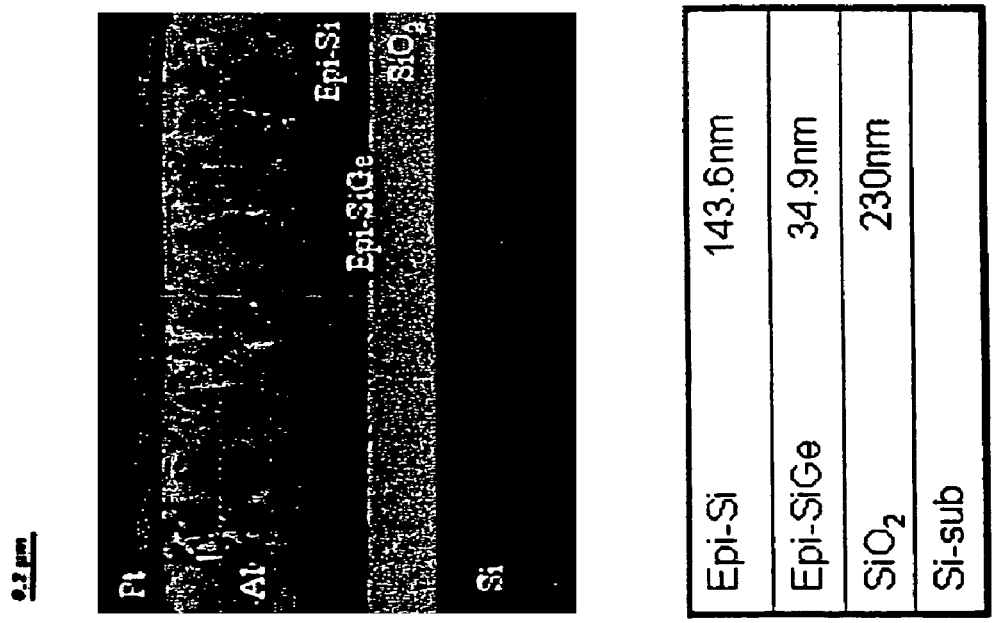
FIG. 2B is a replica of a cross-sectional transmission electron micrograph showing one example of the SOI structure of the present invention having a SiGe layer in lower contact with a SiO$_2$ layer for isolation and in upper contact with an epitaxial Si layer.

FIG. 2B is a replica of a cross-sectional transmission electron micrograph showing one example of a fabricated SiGe buried layer of the present invention. In the depicted structure, the SiGe buried layer (34.9 nm thick) is in direct contact with a lower SiO$_2$ layer (230 nm thick) providing electrical isolation and in contact with an upper epitaxial Si layer (143.6 nm thick).

Figure 3:
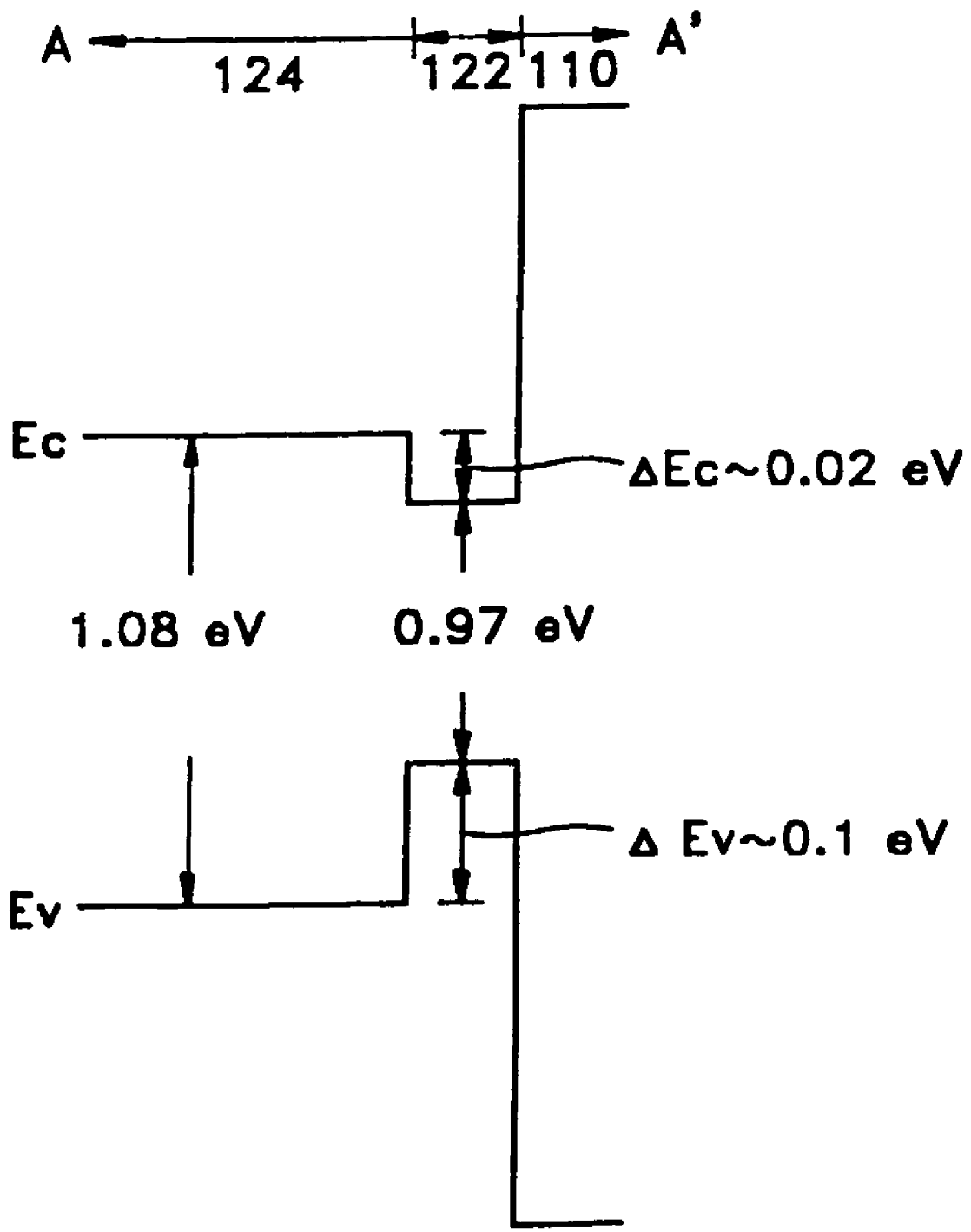
FIG. 3 is a schematic energy band diagram of the materials taken along line A–A' of FIG. 2.
Figure 4:
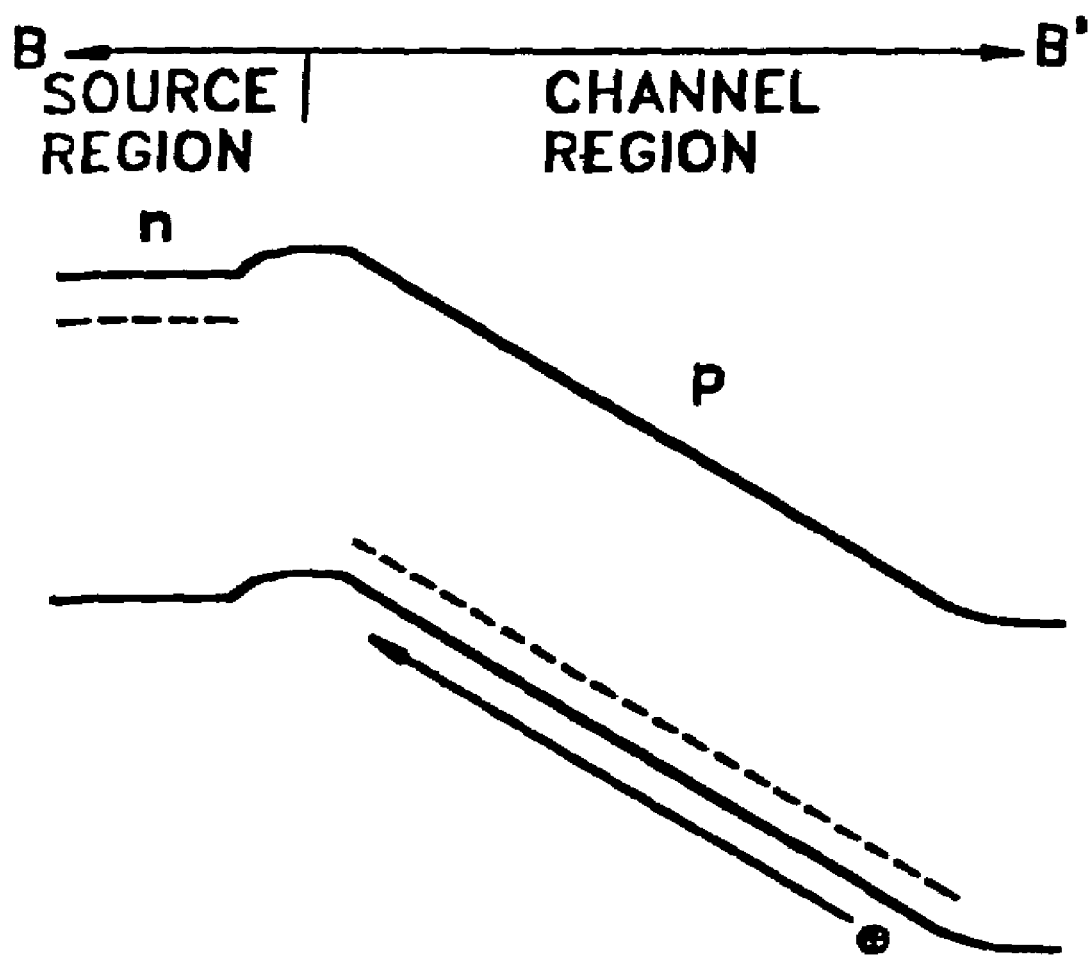
FIG. 4 is a schematic energy band diagram of the materials taken along line B–B' of FIG. 2.

Suppression of the floating body effect on the SOI structure of the present invention will now be described with references to FIGS. 3–4. FIGS. 3 and 4 are energy band diagrams of the SiGe layer 122 taken along lines A–A' and B–B' of FIG. 2A, respectively. The floating body effect is closely associated with holes accumulated in the lower portion of a body region of the SOI structure, which is electrically floated by the insulating layer 110, and significantly affects the operation of an NMOS device. If the MOS device of FIG. 2A is an NMOS transistor, high concentration of n-type of impurities are implanted to form the source region 146 and the drain region 148. A channel is formed between the source and drain regions 146 and 148 near the surface of the silicon layer, which is the device layer 124. If a positive drain voltage is applied to the drain region 148 in order to operate the NMOS transistor, movement of electrons through the channel causes impact ionization, thereby generating a large number of holes. The generated holes are accumulated in the body below the channel since the body on the SOI structure is not grounded. However, the holes easily move to the source region 146 through the SiGe layer 122.

Thus, in a preferred embodiment of the present invention, a semiconductor structure includes an insulator configured to provide electrical isolation between devices formed in the semiconductor structure, a silicon germanium layer in direct contact with the insulator, and a silicon layer in contact with the silicon germanium layer. The silicon layer, due to the respective band gaps of Si and Ge, has a higher band gap than the silicon germanium layer. In one aspect of the present invention, the silicon germanium layer is configured to receive minority carriers from the silicon layer to minimize charge accumulation in the silicon layer. In another aspect of the present invention, the insulator is an insulating layer formed on a semiconductor substrate. According to the invention, the insulating layer can be $SiO_2$, and the semiconductor can be a silicon wafer. The insulator can be, according to the invention, one of a glass, quartz, or sapphire substrate. In another aspect of the present invention, the silicon germanium layer has a germanium concentration of 5 to 30%. In a preferred embodiment, the germanium concentration ranges from 10–25%.

In another aspect of the present invention, the silicon germanium layer is an epitaxial silicon germanium layer grown initially on a separate substrate. The silicon layer can be, according to the invention, an epitaxial silicon layer grown on the epitaxial silicon germanium layer. The silicon germanium layer has a thickness ranging from 20 to 50 nm. In a preferred embodiment, the silicon layer has a thickness ranging from 100 to 200 nm.

In another aspect of the present invention, the semiconductor structure of the present invention includes a drain, a source, and a gate insulator formed above the silicon layer, as shown in FIG. 2A, and configured to control an active region between the source and the drain. In this aspect, the silicon germanium layer is configured to receive minority carriers from the silicon layer to thereby minimize charge accumulation in the silicon layer, and the silicon germanium layer is configured to conduct the minority carriers to the drain.

Referring to FIG. 3, which is an energy band diagram of a junction of silicon layer 124 and SiGe layer 122 in the body region below the channel between the source and drain regions 146 and 148, a potential energy Ec of the conduction band of SiGe layer 122 is lower than that of the silicon layer 124. A potential energy Ev of the valence band thereof is higher than that of the silicon layer 124. Thus, the energy gap or band gap of SiGe layer 122 is about 0.97 eV, which is narrower than 1.08 eV of the silicon layer 124. That is, the SiGe layer 122 exhibits narrow band gap characteristics. In particular, since the potential energy Ev of balance band of SiGe layer 122 increases toward a Fermi level, a potential barrier for holes at the junction between layers 122 and 124 is lowered, thereby preventing accumulation of the holes in the body region and allowing movement of the holes to the SiGe layer 122.

Referring to FIG. 4, which is an energy band diagram of a junction between SiGe layer 122 and source region 146, a potential energy at the source region 146 in which high concentration of n-type of impurities are implanted is higher than that at the body region in which high concentration of p-type of impurities are implanted. Thus, a potential barrier for holes in the SiGe layer 122 within the source region 146 is lowered so that holes moved to the SiGe layer 122 through the body region can further be moved to SiGe layer 122 within source region 146, thereby suppressing the floating body effect which is one disadvantage of a conventional SOI wafer.

Figure 5:
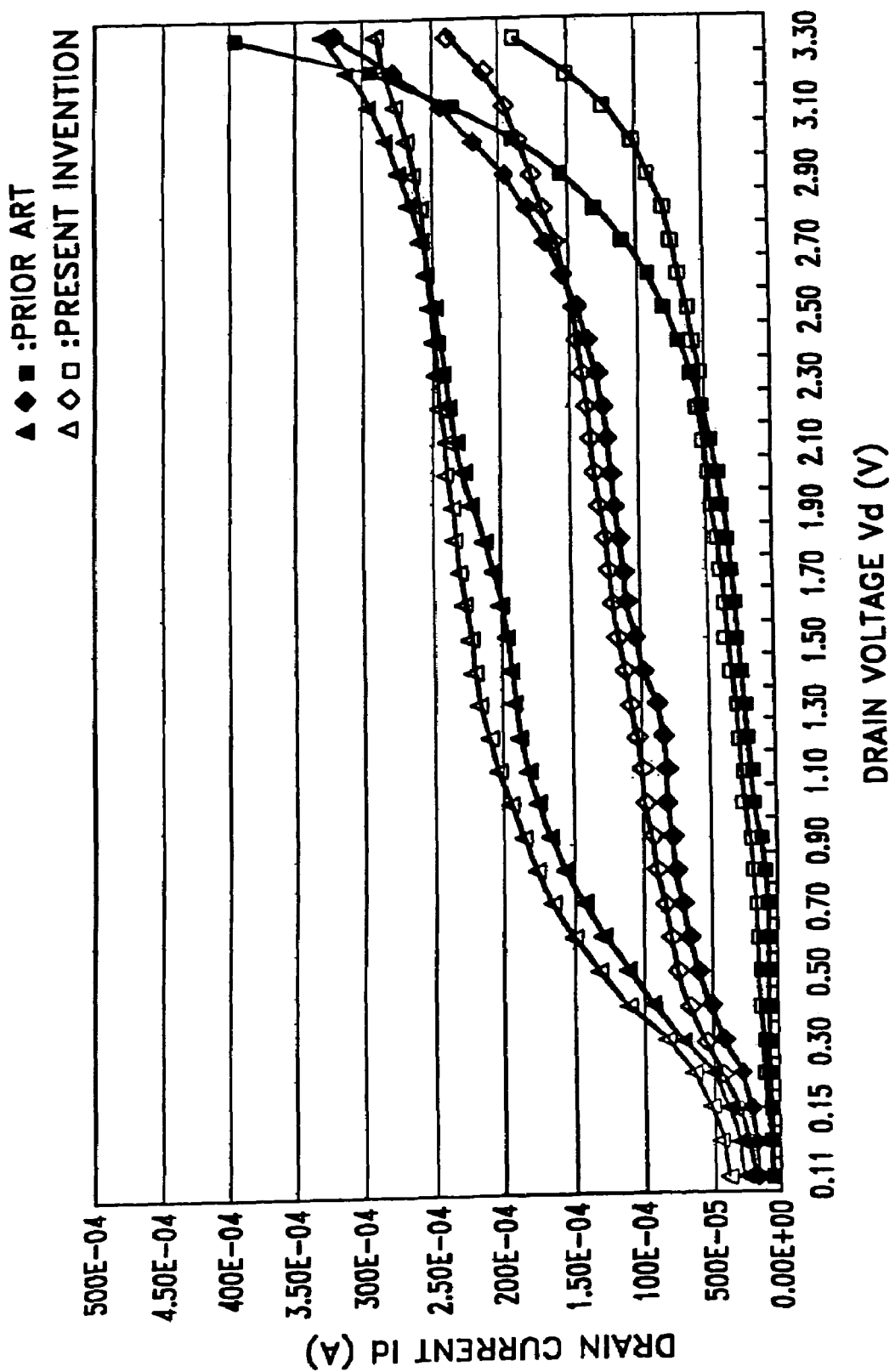
FIG. 5 is a graph in which drain current-drain voltage curves of a MOS transistor formed on the SOI structure of the present invention are compared with those of the MOS transistor formed on a conventional SOI wafer.

FIG. 5 is a graph in which drain current-drain voltage ($I_d$-$V_d$) curves of a MOS transistor formed on the SOI structure of the present invention are compared with those of a MOS transistor formed on a typical SOI (silicon/silicon oxide/silicon) wafer having no SiGe layer. As shown in FIG. 5 on a logarithmic scale, devices formed on conventional SOI wafer show abrupt increases in drain current $I_d$ at specific drain voltages $V_d$, thereby exhibiting a kink effect such as shown at a voltage of 1.05 V at a gate voltage Vg of 1V for the lower set of curves. Devices formed in the SOI structure of the present invention exhibit no kink effect at the earlier drain voltages, and consequently show higher drain currents and higher drain breakdown voltages.

Figure 6:
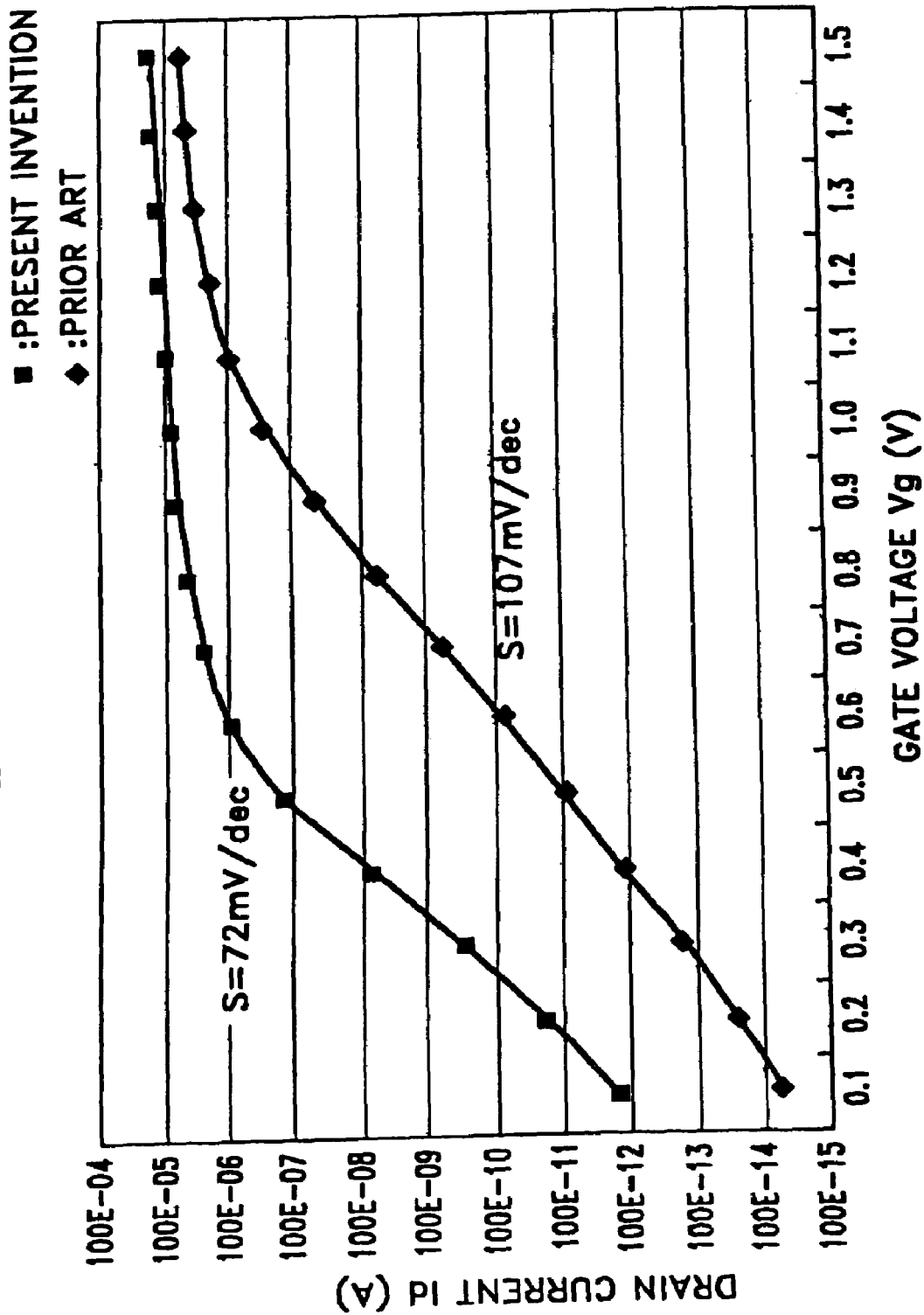
FIG. 6 is a graph in which drain current-gate voltage curves of a MOS transistor formed on the SOI structure of the present invention are compared with those of the MOS transistor of FIG. 1 formed on a conventional SOI wafer.

FIG. 6 is a graph in which drain current-gate voltage ($I_d$-$V_g$) curves of an MOS transistor formed in the SOI structure of the present invention are compared with those of the MOS transistor of FIG. 1 formed on the conventional wafer. As is evident from FIG. 6, the MOS transistor on the SOI structure of the present invention has a subthreshold slope S significantly larger than that on the transistor formed in the conventional SOI wafer. The larger subthreshold slope S increases transconductance and switching speed of MOS transistor fabricated in the SOI structure of the present invention, such as for example a MOS transistor.

Methods of manufacturing a SOI structure having a SiGe layer according to embodiments of the present invention will now be described.

First Embodiment

Figure 7:
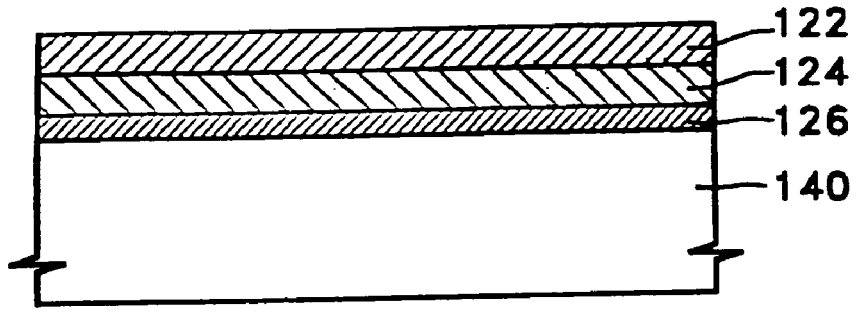
FIGS. 7–12 are cross-sectional views showing a process for fabricating the SOI structure of the present invention.

FIGS. 7–12 are cross-sectional views showing a process for fabricating the SOI structure of the present invention. Referring to FIG. 7, a first SiGe layer 126 is epitaxially grown over a first substrate 140. The first substrate 140 is a monocrystalline silicon substrate used as a seed of the epitaxial growth. After loading the silicon substrate 140, having a purified surface, into a chemical vapor deposition (CVD) apparatus heated to a predetermined temperature, such as for example, 700° C., a reactive gas including silicon (e.g. $Si_2H_6$, $SiH_4$, $SiCl_4$ etc) is supplied with a reactive gas including germanium (e.g. $GeH_4$, $Ge_2H_6$, etc.) to grow the first SiGe layer 126 over the silicon substrate 140. When the first SiGe layer 126 is grown to a predetermined thickness, for example, 10–50 Å, preferably, 20 Å, the Ge reactive gas ceases to be supplied, and continuously, a silicon layer, which will be a device layer 124, is epitaxially grown in situ to a thickness of several hundreds to thousands of Angstroms, for example, between 500 and 1800 Å in this embodiment. Then, the Ge reactive is supplied again to epitaxially grow a second SiGe layer 122 to a thickness of several hundreds to thousands of angstroms, for example, about 300 Å.

Figure 8:
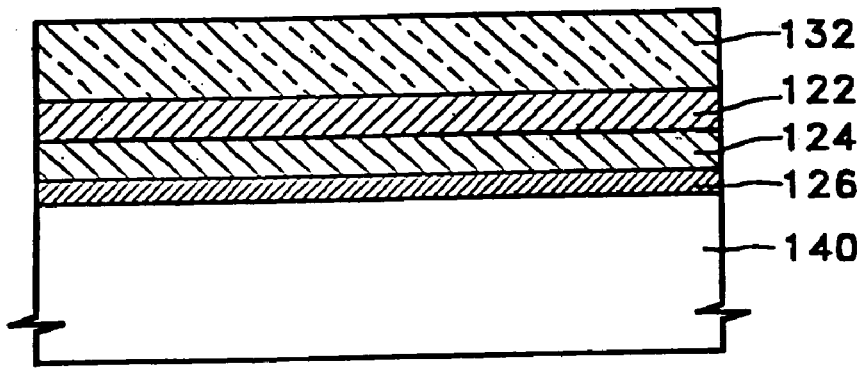

Referring to FIG. 8, a silicon oxide layer is formed, on the epitaxially grown second SiGe layer 122, as an insulating layer 132 to a thickness of several hundreds to thousands of Angstroms, for example, about 1,000 Å. The insulating layer 132 may be deposited using various chemical or physical deposition techniques or formed by thermal oxidation techniques, all of which are known to those skilled in the art.

Figure 9:
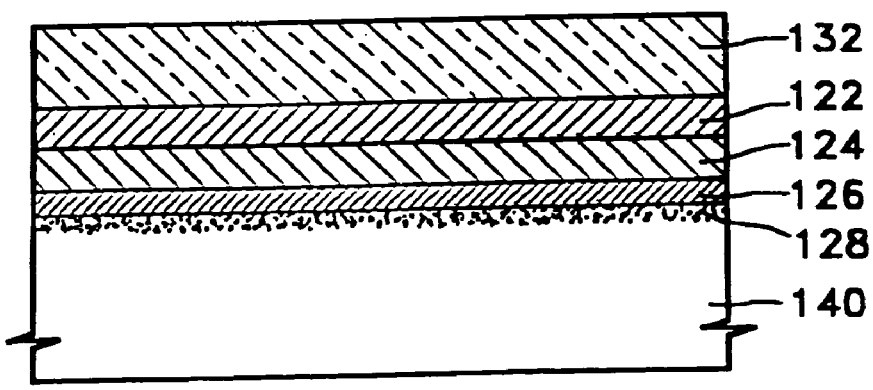

Referring to FIG. 9, hydrogen ions are implanted into the top of the first substrate 140 to form a hydrogen implantation region 128. Techniques for implanting hydrogen ions (and separating a substrate along the hydrogen implantation region) are described in U.S. Pat. Nos. 5,882,987 and 6,033,974, the entire contents of which are incorporated herein by reference. More specifically in this example, an ion implantation energy is controlled such that the projected range $R_p$ of the implanted ions reaches a depth of 50–100 Å beneath the first SiGe layer 126, and an implantation dose is in the range of $3.5 \times 10^{15}$ to $3.5 \times 10^{17}$ atoms/cm². Setting the projected range $R_p$ in this way facilitates separation caused by a mismatch between the silicon substrate 140 and the first SiGe layer 126.

Figure 31A:
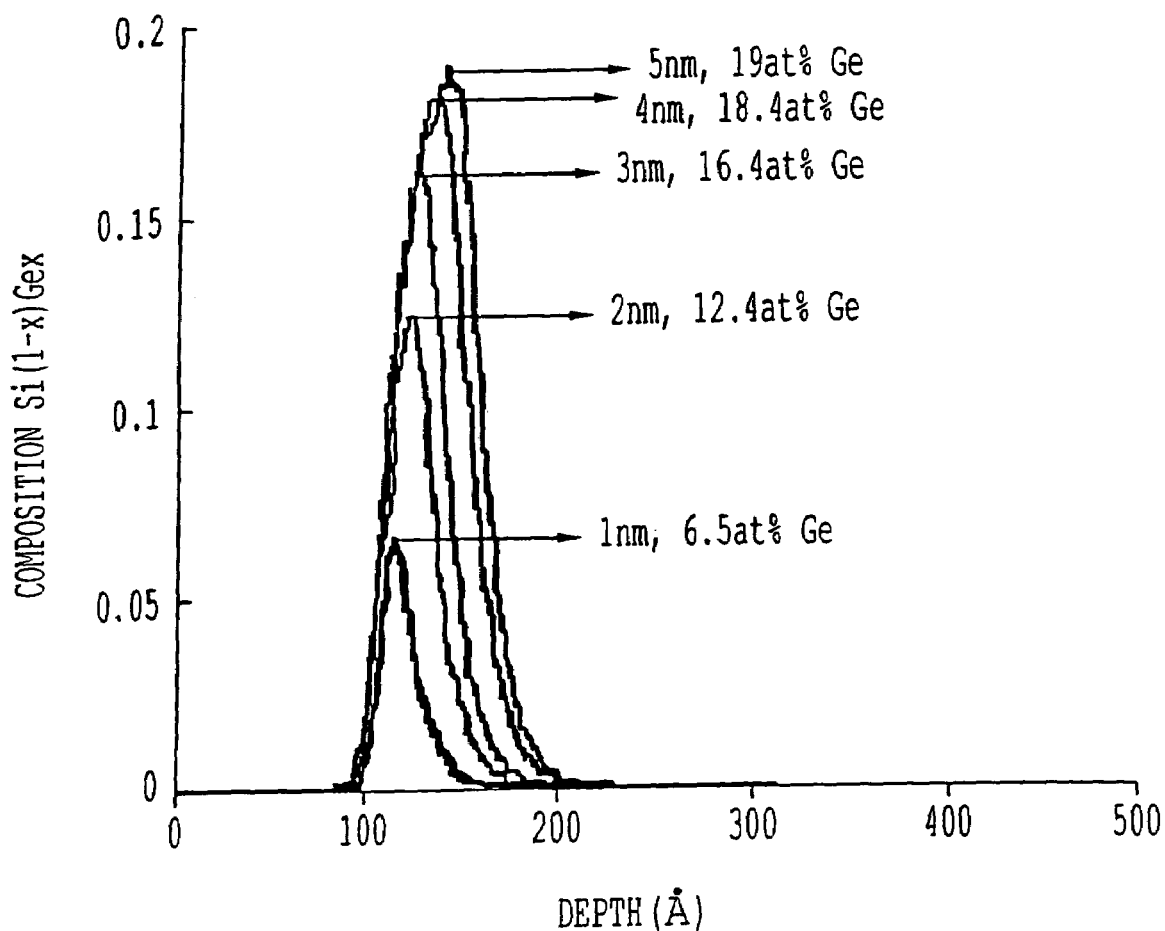
FIG. 31A is a graph depicting a secondary ion mass spectrometer (SIMS) profile of atomic Ge concentration as a function of Ge layer thickness.
Figure 31C:
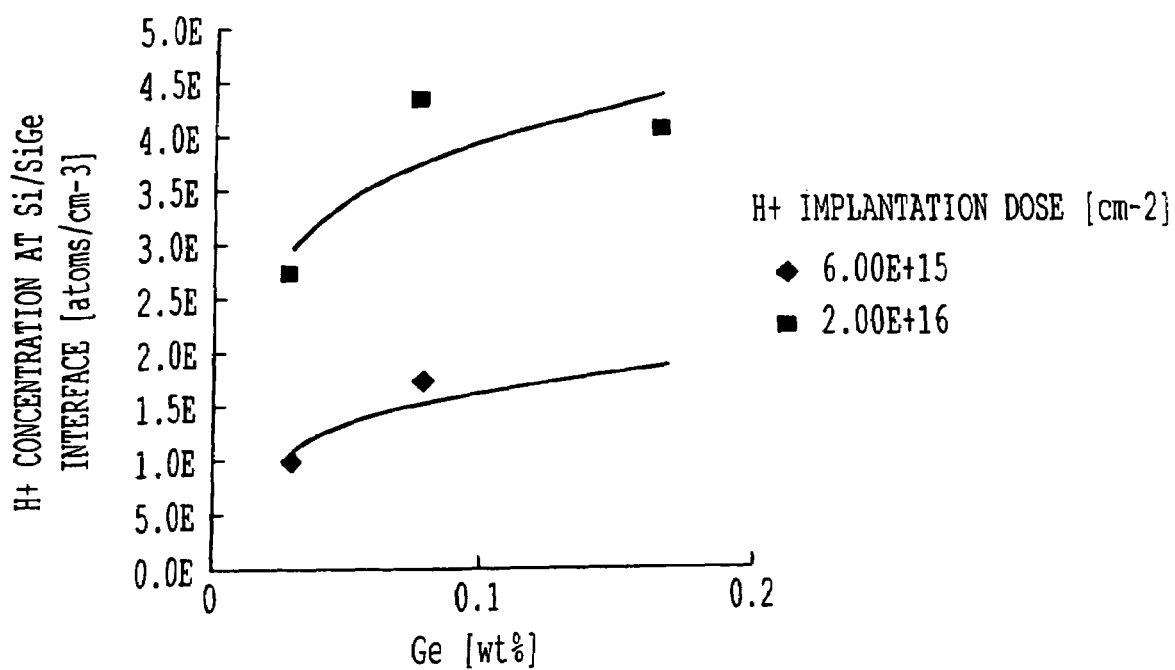

FIG. 31A depicts a secondary ion mass spectrometer (SIMS) profile of atomic Ge concentration as a function of Ge layer thickness, showing that Ge concentration increased with Ge layer thickness although the gas concentration of $GeH_4$ was fixed. FIG. 31B depicts the solubility of $H_2$ in SiGe layer is two times higher than in Si layer. FIG. 31C depicts concentration of hydrogen accumulated in SiGe layer increased with Ge concentration. As can be seen from FIG. 31A, 31B, and 31C, the amount of hydrogen accumulated at the interface is directly related to the Ge concentration. The propagation of a crack (i.e., cleavage) along the hydrogen accumulated interface is caused by the mismatch between the SiGe layer and the Si.

Figure 32:
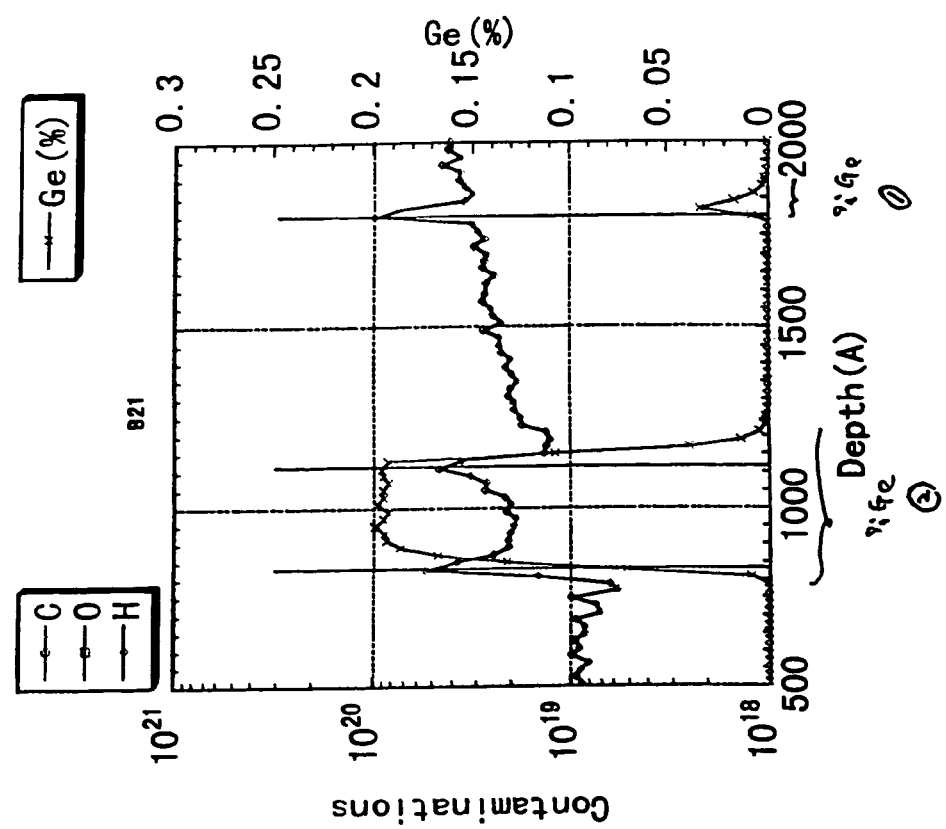
FIGS. 32 and 33 are graphs depicting atomic concentration profiles for two different hydrogen implants.
Figure 33:
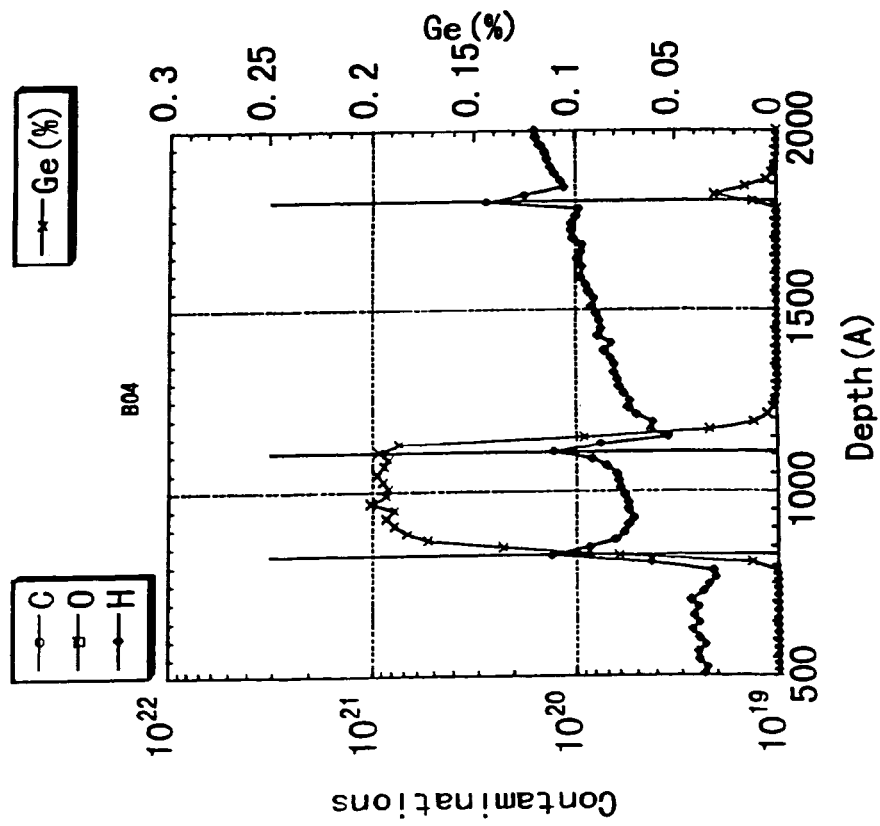
Figure 34:
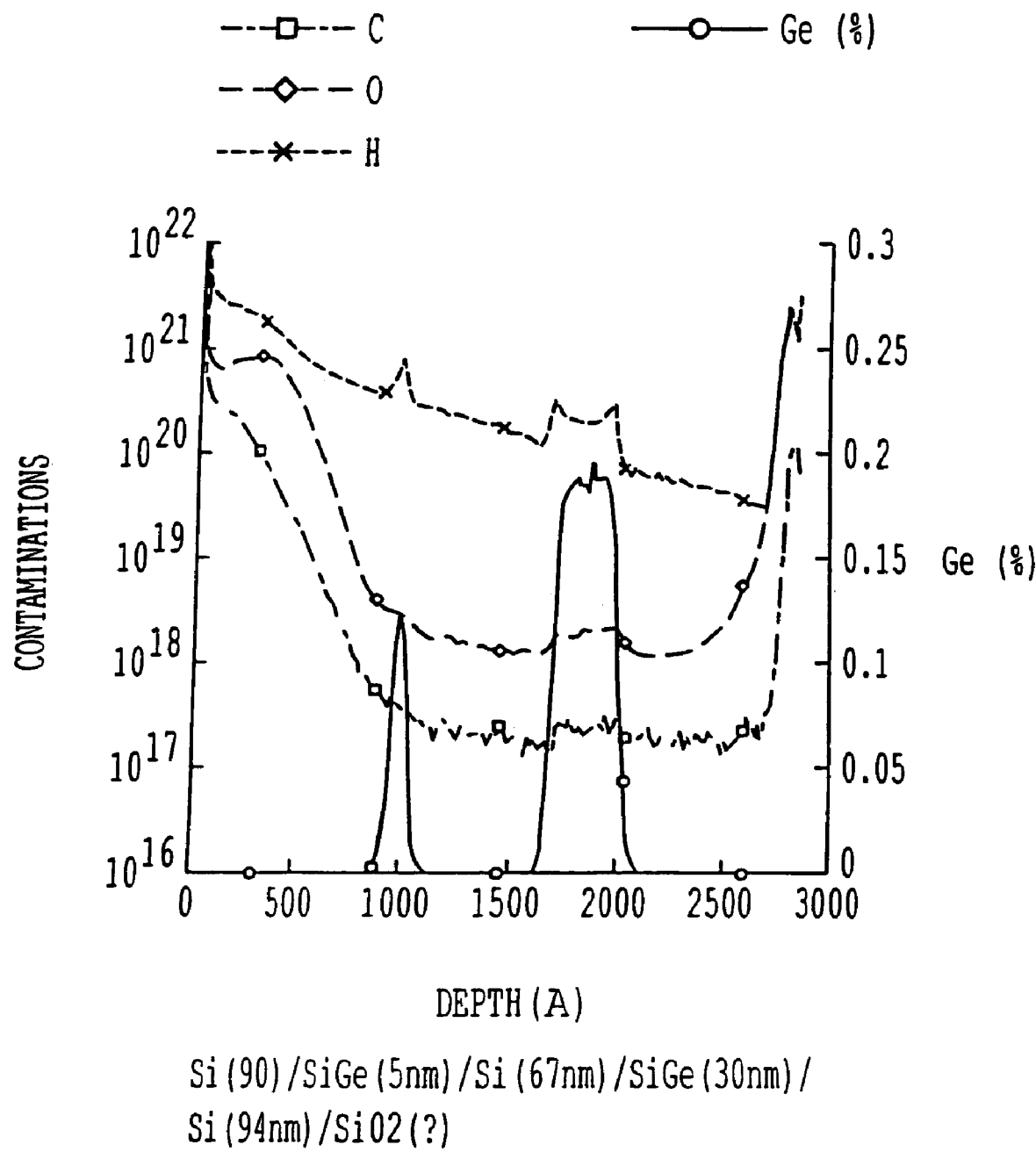
FIG. 34 is graph depicting a SIMS profile across multiple SiGe/Si epitaxial structures.
Figure 35:
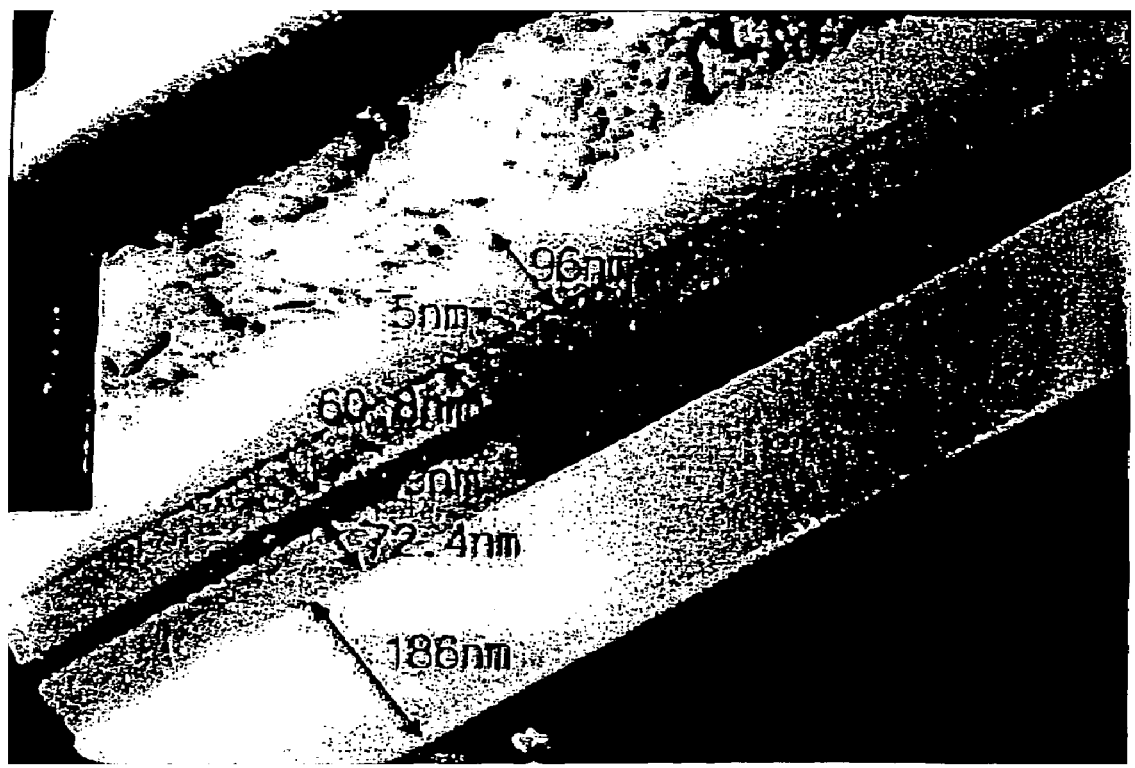
FIG. 35 is a depiction of a cross-sectional transmission electron micrograph of a SiGe/Si epitaxial structure similar to that depicted in FIG. 35.

The resultant surface roughness following cleavage is a function of the hydrogen implant dose and the SiGe layer thickness. The effect of hydrogen accumulation at an interface between SiGe and Si is shown in FIGS. 32 and 33 for two different hydrogen implants into an epitaxial SiGe/Si structure having doses of $2 \times 10^{16}$ atoms/cm² and $6 \times 10^{15}$ atoms/cm², respectively The absolute concentrations of Ge and hydrogen dose are not critical and the values given here are shown only to illustrate the effect of hydrogen accumulation at SiGe interfaces and are not given to unduly limit the present invention. The accumulation of hydrogen at the interface is driven by strain at the interface arising from the difference in lattice constants between the Si and the epitaxial SiGe layer. FIG. 34 is a SIMS profile across a SiGe/Si epitaxial structure showing the same effect of hydrogen accumulation for hydrogen accumulations at the interface approaching the maximum soluble limit of hydrogen in the SiGe alloy of 20% Ge. As before, hydrogen accumulates preferentially at the interfaces. FIG. 35 is a depiction of a cross-sectional transmission electron micrograph of a SiGe/Si epitaxial structure similar to that epitaxial SiGe/Si structure depicted in FIG. 34. Note the contrast in the electron micrograph about the first SiGe layer with a thickness of 29 nm. The accumulation of the hydrogen at the SiGe interface disrupts the lattice of the SiGe/Si epitaxial structure near the interface such that a cavity is created as the solid is converted to a hydride. For low dose rate implants, the resultant cavity dimension can be small, resulting in a cleavage having less than a 50 Å surface roughness for a dose rate of $5 \times 10^{16}$ atoms/cm², after an anneal at 400° C. for 30 min, for a SiGe layer with a 20% concentration.

Cleavage along the disrupted interface provides a method according to the present invention for separating the SiGe/Si epitaxial structures at one of the internal interfaces between the SiGe and the Si.

Figure 10:
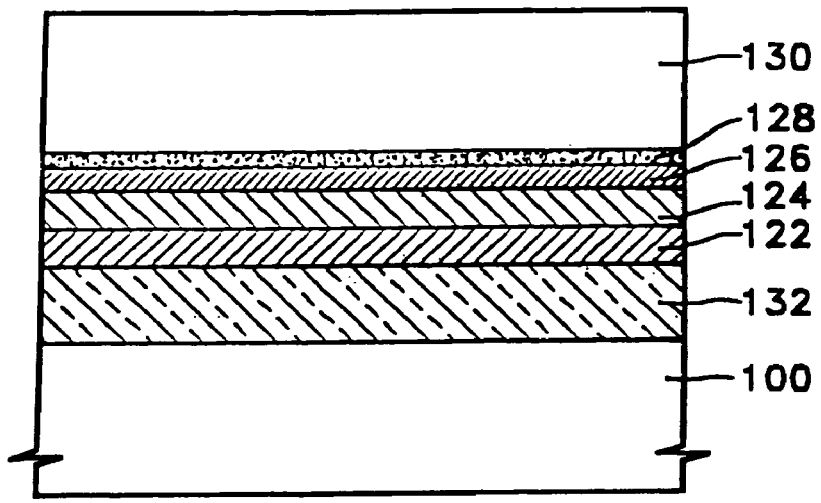

Referring now to FIG. 10, the surface of the insulating layer 132 formed on the topmost surface of the first substrate 140 is cleaned, and then a second substrate 100 is bonded to the insulating layer 132. The bonding process is performed by compressing both substrates 100 and 140 at room temperature. Then, the substrate 100 is annealed at 400–600° C. to form a hybrid phase at the hydrogen implantation region 128 thereby facilitating a subsequent cleaving or separation. While the second substrate 100 has been shown in this embodiment without an insulating layer, the second substrate 100 having an insulating layer such as silicon oxide thereon may be used. Alternatively, the second substrate can itself be an insulating substrate such as for example glass, quartz, or sapphire.

Figure 11:
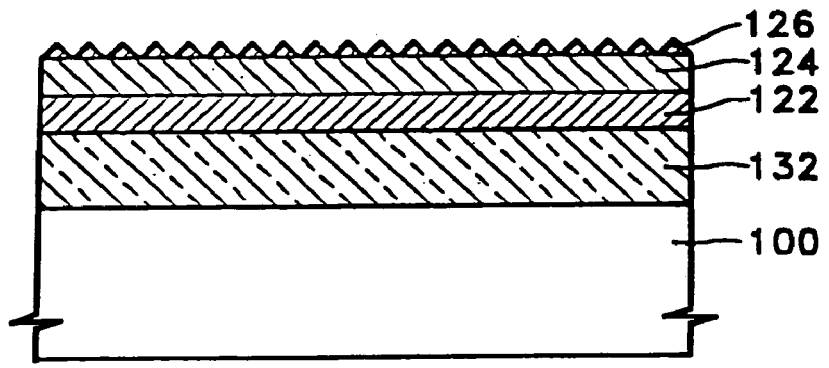

Referring to FIG. 11, the substrate 130 is separated along the hydrogen implantation region 128 and removed. To make the bonding between each layer on the second substrate 100 stronger, the substrate 100 is annealed at above 1,100° C. in a nitrogen ambient for a time in the range of 1 to 2 hours.

Figure 12:
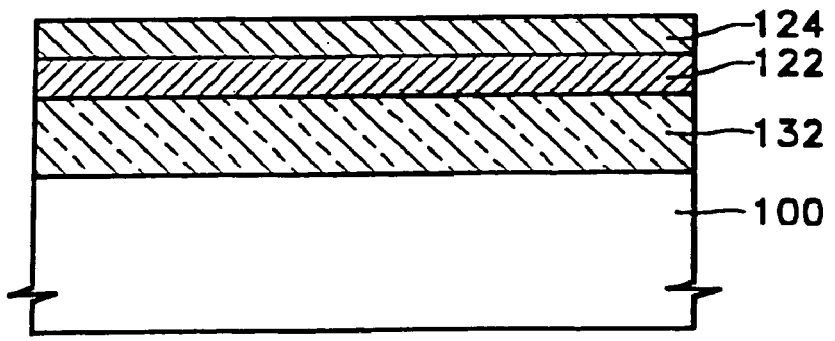

Referring to FIG. 12, the first SiGe layer 126 remaining on the device layer 124 is selectively removed using a chemical etch, thereby completing the manufacture of the SOI structure of the present invention having the second SiGe layer 122 directly in contact with the insulating layer 132. In order to make the exposed surface of the device layer 124 smooth, the wafers may be transferred to an epitaxial reaction chamber to perform hydrogen annealing in a hydrogen atmosphere above 1150° C. for >5 min.

Second Embodiment

FIGS. 13–18 are cross-sectional views showing a process for fabricating the SOI structure of the present invention. Unlike the first embodiment, the second embodiment isolates the buried SiGe layer by separation implanted oxygen (SIMOX). The SIMOX process implants oxygen ions into a silicon substrate upon which thermal oxidation forms an intermediate insulating layer. The SIMOX techniques are described in Sadao Nakashima "High-quality Low-dose SIMOX Wafers", IEICE TRANS ELECTRON, VOL. E80C, NO.3, pp 364–369, March 1997, the entire contents of which are incorporated herein by reference. Further, SIMOX techniques are described in U.S. Pat. No. 6,486,037, the entire contents of which are incorporated herein by reference.

Figure 13:
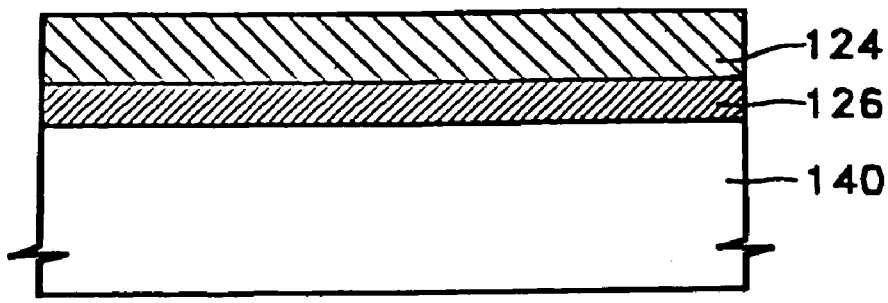
FIGS. 13–18 are cross-sectional views showing another process for fabricating the SOI structure of the present invention.

Referring to FIG. 13, a SiGe layer 126 is epitaxially grown over a substrate 140. The substrate 140 is a monocrystalline silicon substrate used as a seed of this epitaxial growth. After loading the silicon substrate 140 having a purified surface into a chemical vapor deposition (CVD) apparatus heated to a predetermined temperature, for example, 700° C., a reactive gas including silicon, as discussed previously, is supplied with a reactive gas including germanium, as discussed previously) to grow the SiGe layer 126 over the silicon substrate 140. When the SiGe layer 126 is grown to a predetermined thickness, for example, 200–400 Å, preferably, 300 Å, the reactive gas including Ge ceases to be supplied, and continuously, a silicon layer, which will be a device layer 124, is epitaxially grown in situ to a thickness of several hundreds to thousands of angstroms, for example, about 2,400 Å in this embodiment.

Figure 14:
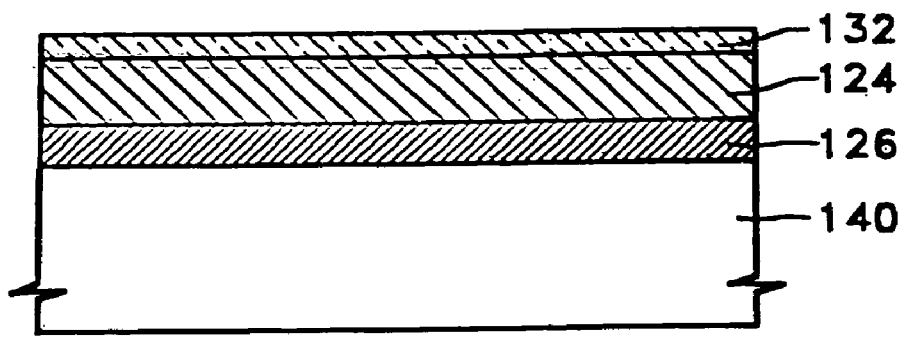

Referring to FIG. 14, a silicon oxide layer is formed on the epitaxially grown device layer 124 as an insulating layer 132 to a thickness of several hundreds to thousands of angstroms, for example, about 1,000 Å. The insulating layer 132 may be deposited using the various deposition and thermal oxidation techniques previously noted.

Figure 15:
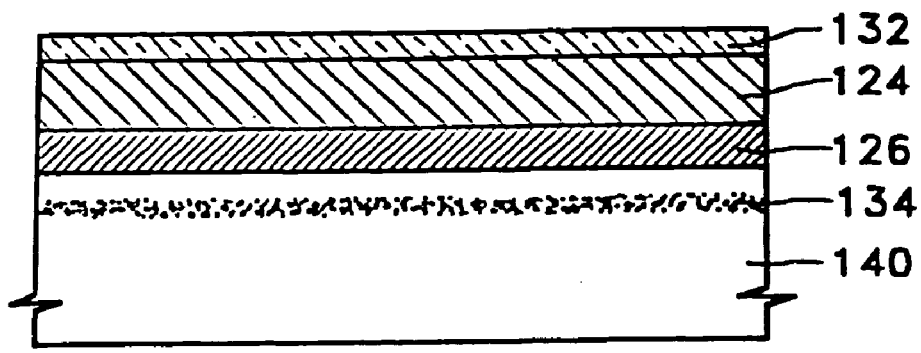

Referring to FIG. 15, oxygen ions are implanted into the top of the substrate 140 to form an oxygen implantation region 134. More specifically, an ion implantation energy is controlled such that the projected range Rp of the implanted ions is about 4,200 Å from the surface of the insulating layer 132, i.e., about 500 Å from below the SiGe layer 126. In this embodiment, ion implantation is performed at an implantation energy of 180 KeV and at an implantation dose of $3.0 \times 10^{15}$ to $4.5 \times 10^{17}$ atoms/cm$^2$.

Figure 16:
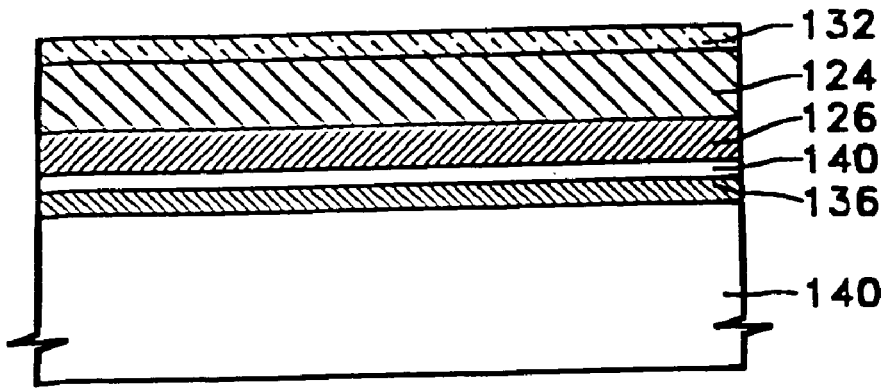

Referring to FIG. 16, a high temperature anneal is performed to oxidize the oxygen implantation region 134 and form an insulating layer 136 formed of silicon oxide. The high temperature annealing is performed at about 1,300° C. for several hours, for example, about 4 hours, in an argon atmosphere containing less than 1% oxygen.

Figure 17:
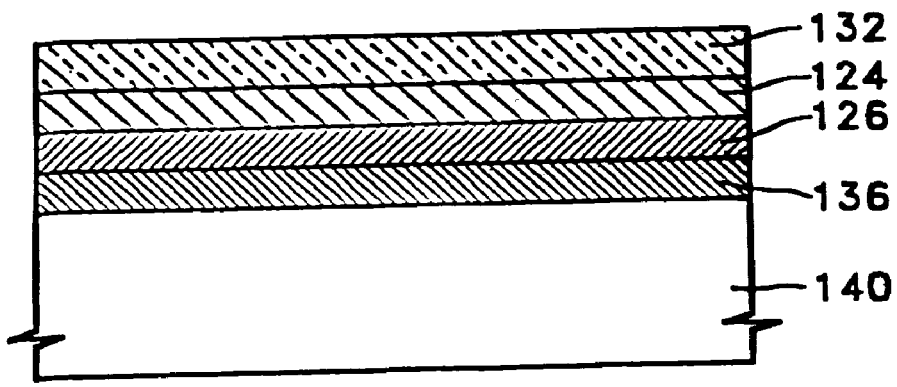

Referring to FIG. 17, a high temperature thermal oxidation is performed at above 1,300° C. so that the silicon substrate 140 between the oxygen implantation region 134 and the SiGe layer 126 is completely oxidized. Thus, the top surface of the insulating layer 136 is in contact with the SiGe layer 126. The high temperature thermal oxidation is performed in an argon atmosphere containing oxygen greater than 50%. Here, the thickness of the insulating layer 136 is approximately 1,000 Å.

Figure 18:
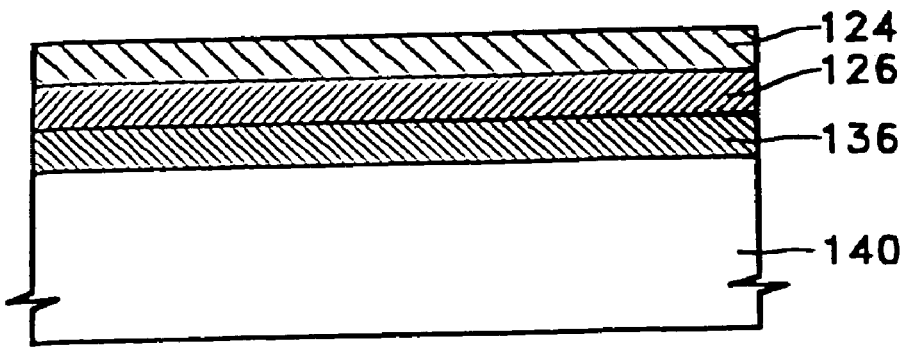

Referring to FIG. 18, the insulating layer 132 formed on the topmost surface of the substrate 140 is selectively removed using wet chemicals to complete the manufacture of the SOI structure of the present invention.

Third Embodiment

FIGS. 19–24 are cross-sectional views showing a process for fabricating the SOI structure of the present invention. Like the first embodiment, the third embodiment involves implanting hydrogen ions to form a cleavage region. The difference is that a single SiGe layer is formed.

Figure 19:
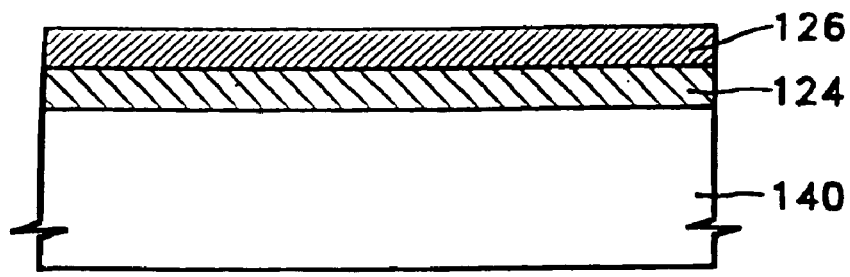
FIGS. 19–24 are cross-sectional views showing another process for fabricating the SOI structure of the present invention.

Referring to FIG. 19, a silicon layer 124 is epitaxially grown over a first substrate 140 formed of silicon. The first substrate 140 is a monocrystalline silicon substrate used as a seed of this epitaxial growth. The silicon layer 124 is epitaxially grown to a thickness of several hundreds to thousands of angstroms, for example, 500 and 1800 Å in this embodiment. Then, the reactive gas including germanium is supplied again to epitaxially grow a SiGe layer 126 to a thickness of several hundreds to thousands of angstroms, for example, about 300 Å.

Figure 20:
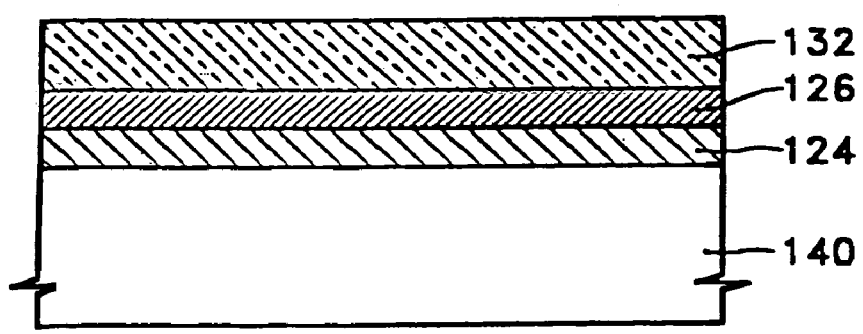

Referring to FIG. 20, a silicon oxide layer is formed on the epitaxially grown SiGe layer 126 as an insulating layer 132 to a thickness of several hundreds to thousands of angstroms, for example, about 1,000 Å. The insulating layer 132 may be deposited using various chemical or physical deposition techniques or formed by thermal oxidation.

Figure 21:
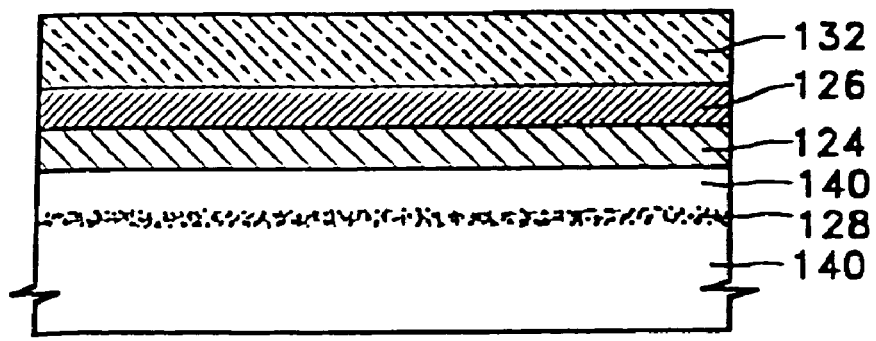

Referring to FIG. 21, hydrogen ions are implanted into the top of the first substrate 140 to form a hydrogen implantation region 128. More specifically, an ion implantation energy is controlled such that the projected range Rp of the implanted ions reaches a depth of several tens to hundreds of Angstroms beneath the silicon layer 124. The ion implantation is performed at an implantation energy of 95 KeV and at an implantation dose of $3.5 \times 10^6$ to $3.5 \times 10^{17}$ atoms/cm$^2$.

Figure 22:
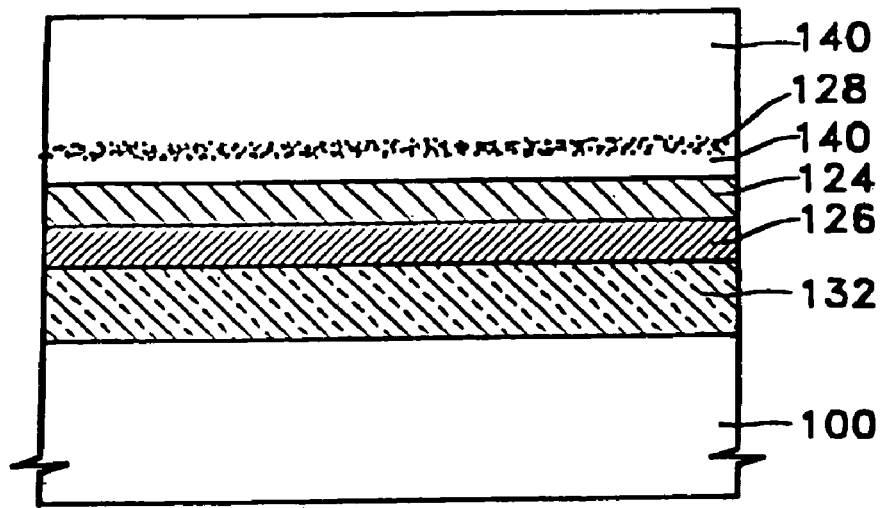

Referring to FIG. 22, the surface of the insulating layer 132 formed on the topmost surface of the first substrate 140 is cleaned, and then a second substrate 100 is bonded to the insulating layer 132. The bonding process is performed by compressing both substrates 100 and 140 at room temperature. Then, the substrate 100 is annealed at 400–600° C. to form a hybrid phase at the hydrogen implantation region 128 thereby facilitating a subsequent cleaving or separation. While only the second substrate 100 has been used in this embodiment, a second substrate having an insulating layer such as silicon oxide may be used, or as previously discussed, the second substrate itself can be insulating.

Figure 23:
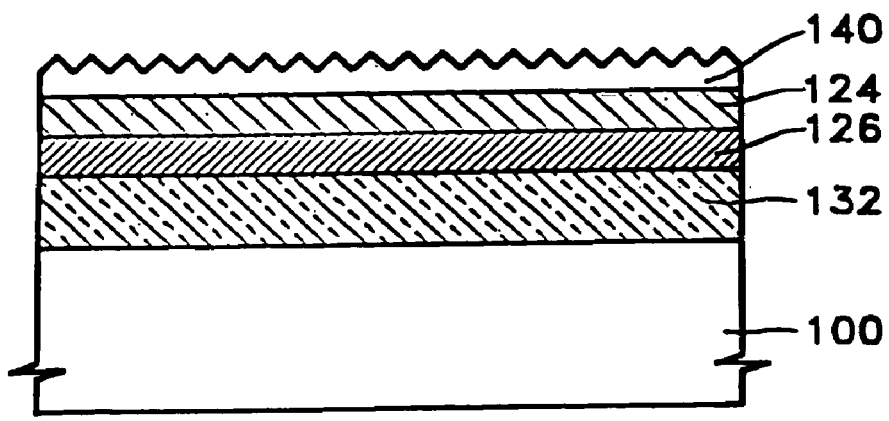

Referring to FIG. 23, the first substrate 140 is separated along the hydrogen implantation region 128 and removed. Techniques for implanting hydrogen ions to separate a substrate along the hydrogen implantation region are described in U.S. Pat. Nos. 5,882,987 and 6,033,974 described above. To make the bonding between each layer on the second substrate 100 stronger, the substrate 100 is annealed at above 1,100° C. for a time in the range of 1 to 2 hours.

Figure 24:
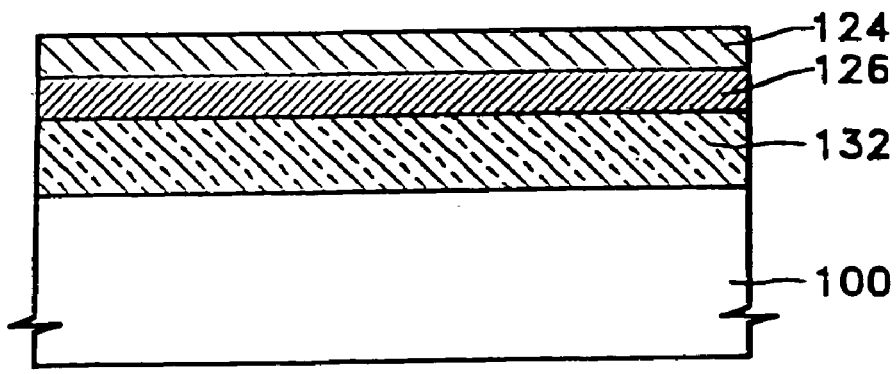

Referring to FIG. 24, a part of the first substrate 140 remaining on the device layer 124 is selectively removed using a chemical etch or by chemical mechanical polishing (CMP) to expose the device layer 124, thereby completing the manufacture of a SOI structure having the SiGe layer 126 formed directly on the insulating layer 132. In order to make the exposed surface of the device layer 124 smooth, the substrate 100 may be transferred to an epitaxial reaction chamber to perform hydrogen annealing in a hydrogen atmosphere.

Fourth Embodiment

Figure 25:
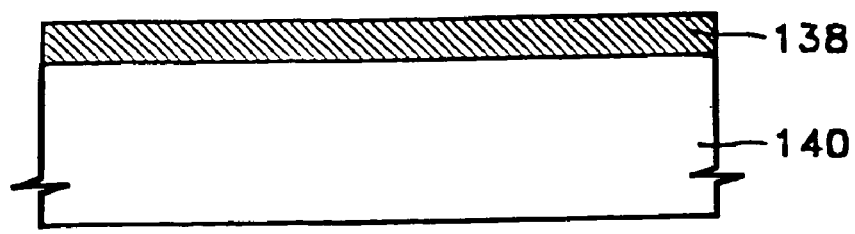
FIGS. 25–30 are cross-sectional views showing another process for fabricating the SOI structure of the present invention.

FIGS. 25–30 are cross-sectional views showing a process for fabricating a bonded SOI structure according to a fourth embodiment of the present invention. Referring to FIG. 25, a porous silicon layer 138 is formed on a first substrate 140 made of silicon. The first substrate 140 is a single crystalline silicon substrate, and anodization is performed on a surface of the single crystalline silicon substrate 140 using an HF solution to form the porous silicon layer 138. Anodization techniques for forming a porous silicon layer are described in U.S. Pat. No. 5,876,497, the entire contents of which are incorporated herein by reference. In a preferred embodiment of the present invention, anodization is performed in 40% HF+C$_2$H$_5$OH (2:1) and with current density of 7 mA/cm$^2$ to form the porous silicon layer 138 having a thickness of 12 μm.

Figure 26:
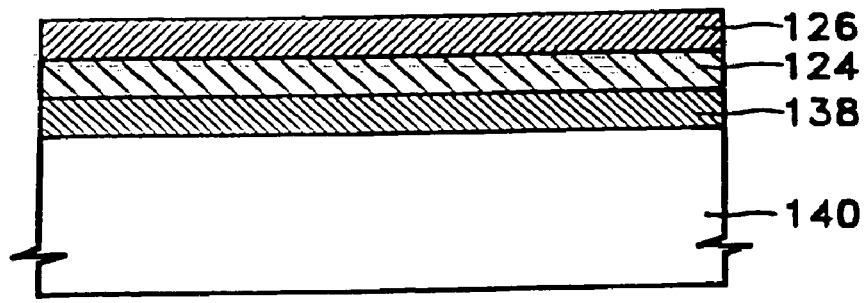

Referring to FIG. 26, a silicon layer 124 is epitaxially grown on the porous silicon layer 138 to a predetermined thickness, for example, several hundreds to thousands of Angstroms, 500 and 1800 Å in this embodiment. Then, the reactive gas including germanium is supplied to epitaxially grow a SiGe layer 126 to a thickness of several hundreds to thousands of angstroms, for example, about 300 Å.

Figure 27:
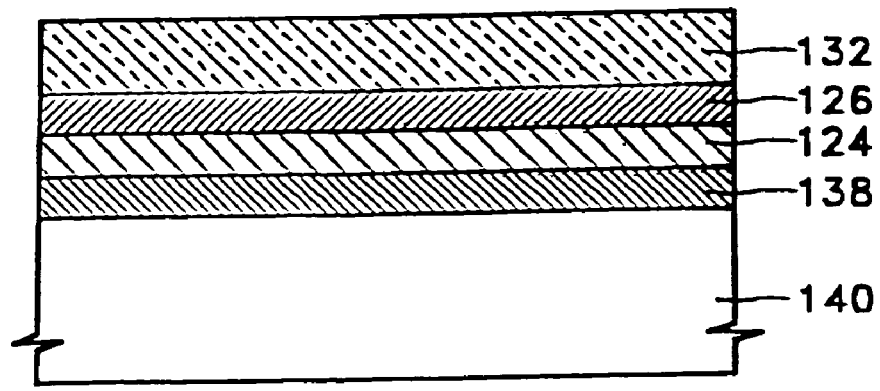

Referring to FIG. 27, a silicon oxide layer is formed on the SiGe layer 126 as an insulating layer 132 to a thickness of several hundreds to thousands of angstroms, for example, about 1,000 Å. The insulating layer 132 may be deposited using various chemical or physical deposition techniques or formed by thermal oxidation.

Figure 28:
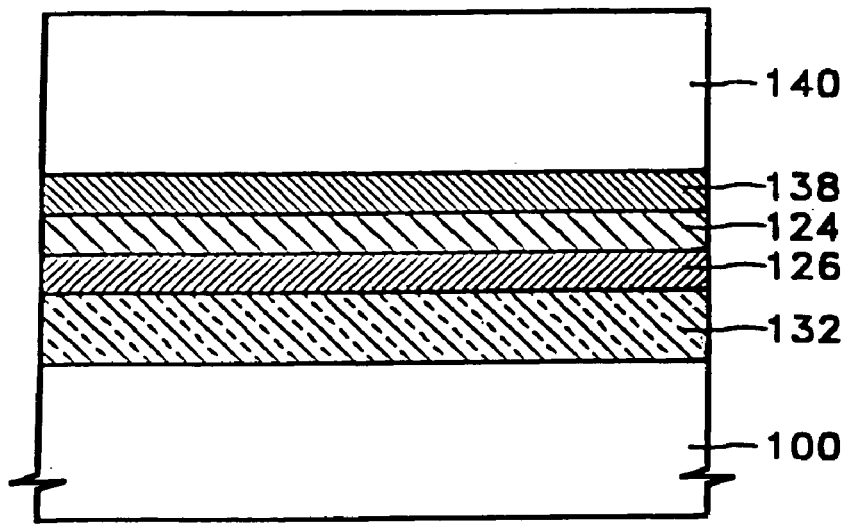

Referring to FIG. 28, the surface of the insulating layer 132 formed on the topmost surface of the first substrate 140 is cleaned, and then a second substrate 100 is bonded to the insulating layer 132, followed by high temperature annealing. The bonding process is performed by compressing both substrates 100 and 140 at room temperature. Then, the second substrate 100 is annealed at about 1,180° C. While the second substrate 100 has been shown in this embodiment without an insulating layer, the second substrate 100 having an insulating layer such as silicon oxide thereon may be used, or as previously discussed the second substrate itself can be insulating.

Figure 29:
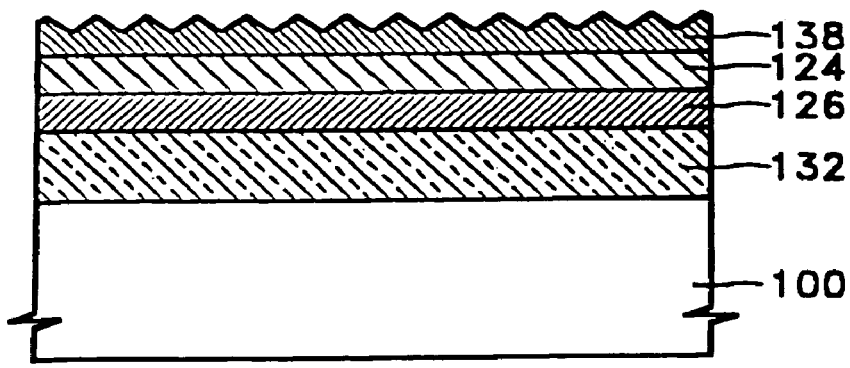

Referring to FIG. 29, the first substrate 140 is separated along the porous silicon layer 138 and removed.

Figure 30:
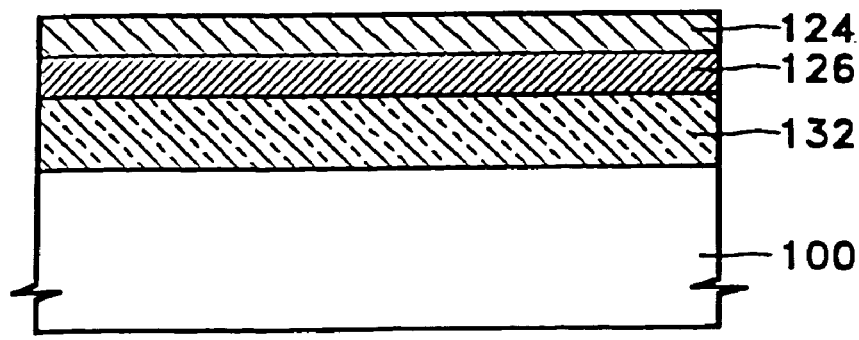

Referring to FIG. 30, a part of the porous silicon layer 138 remaining on a device layer 124 as shown in FIG. 29 is selectively removed using a chemical etch or by chemical mechanical polishing (CMP) to expose the device layer 124, thereby completing the manufacture of a SOI structure having the SiGe layer 126 formed directly on the insulating layer 132.

A mixture of 40% HF, 70% $HNO_3$, and 98% $CH_3COOH$ is used as an etching solution for removing the porous silicon layer 138. To make the exposed surface of the device layer 124 smooth and to promote boron out-diffusion, the substrate 100 may be transferred to an epitaxial reaction chamber to perform hydrogen annealing in a hydrogen atmosphere at a temperature of 1,000° C. at a pressure of 760 Torr.

As described above, according to the present invention, a SiGe layer interposed between a silicon layer and an insulator of a silicon-on-insulator structure and having a narrow band gap is formed in a body and a source/drain region of a semiconductor device, the SiGe buried layer suppresses the floating body effect and the kink effect and increases the breakdown voltage of a drain of a device formed with the buried SiGe layer, thus improving transconductance and switching speed of a MOS transistor formed thereon. Furthermore, the methods of manufacturing a bonding SOI structure according to this invention are readily implemented and facilitate the control of thickness uniformity of the epitaxial SiGe and Si layers.

Numerous modifications and variations of the present invention are possible in light of the above teachings. It is therefore to be understood that within the scope of the appended claims, the invention may be practiced otherwise than as specifically described herein.

The invention claimed is:

1. A semiconductor structure comprising:
   an insulator configured to provide electrical isolation;
   a silicon germanium layer in direct contact with said insulator; and
   a silicon layer in contact with said silicon germanium layer, said silicon layer having a higher band gap than said silicon germanium layer,
   wherein a source, a drain and an active region between said source and said drain, are formed in said silicon germanium layer and said silicon layer, n-type impurities or p-type impurities are implanted in said silicon germanium layer and said silicon layer within each of said source, said drain and said active region, and said insulator comprises: an insulating layer deposited directly on said silicon germanium layer; and a sapphire substrate bonded to said insulating layer.

2. The structure of claim 1, wherein said silicon germanium layer is configured to receive minority carriers for the structure from the silicon layer to minimize charge accumulation in the silicon in the silicon layer.

3. The structure of claim 1, wherein the insulating layer comprises $SiO_2$.

4. The structure of claim 1, wherein the silicon germanium layer has a germanium concentration of 5 to 30%.

5. The structure of claim 4, wherein the germanium concentration ranges from 10–25%.

6. The structure of claim 1, wherein the silicon layer comprises an epitaxial silicon layer grown on a separate substrate.

7. The structure of claim 6, wherein the silicon germanium layer comprises an epitaxial silicon germanium layer grown on said epitaxial silicon layer.

8. The structure of claim 1, wherein the silicon germanium layer has a thickness ranging from 20 to 50 nm.

9. The structure of claim 1, wherein the silicon layer has a thickness ranging from 100 to 200 rim.

10. The structure of claim 1, further comprising:
   a gate insulator formed above said silicon layer; and
   a gate electrode formed above said gate insulator, said gate electrode configured to control an active region between said source and said drain.

11. The structure of claim 10, wherein the silicon germanium layer is configured to receive minority carriers for the structure from the silicon layer to minimize charge accumulation in the silicon layer.

12. THe structure of claim 10, wherein the silicon germanium layer is configured to conduct minority carriers for the structure to said source.

13. The structure of claim 11, wherein the structure is an NMOS transistor, n-type impurities are implanted in said silicon germanium layer and said silicon layer within each of said source and said drain, p-type impurities are implanted in said silicon germanium layer and said silicon layer within said active region, and said minority carriers for the structure are holes.

* * * * *